United States Patent [19]

Kasumi et al.

[11] Patent Number: 5,572,563
[45] Date of Patent: Nov. 5, 1996

[54] MIRROR UNIT AND AN EXPOSURE APPARATUS USING THE UNIT

[75] Inventors: Kazuyuki Kasumi, Machida; Yutaka Watanabe, Isehara, both of Japan

[73] Assignee: Canon Kabushiki Kaisha, Tokyo, Japan

[21] Appl. No.: 357,650

[22] Filed: Dec. 16, 1994

[30] Foreign Application Priority Data

Dec. 20, 1993 [JP] Japan .................................. 5-319725

[51] Int. Cl.$^6$ ...................................................... G21K 5/00
[52] U.S. Cl. ................... 378/34; 378/82; 378/145
[58] Field of Search ................... 378/34, 82, 43, 378/145

[56] References Cited

U.S. PATENT DOCUMENTS 2,617,942  11/1952  McLachlan .............................. 378/43
5,390,228  2/1995  Niibe et al. ............................. 378/34

FOREIGN PATENT DOCUMENTS 5-100096  4/1993  Japan .

*Primary Examiner*—Craig E. Church
*Attorney, Agent, or Firm*—Fitzpatrick, Cella, Harper & Scinto

[57] ABSTRACT

A mirror unit includes a mirror having a reflecting surface, a holding member for supporting the mirror and an airtight chamber incorporating the mirror, supported by the holding member, in an airtight state. Either the mirror or the holding member constitutes a portion of a side wall of the airtight chamber. The mirror unit can be suitably used in an exposure apparatus which uses a synchrotron radiation light source or the like as a light source.

16 Claims, 14 Drawing Sheets

MIRROR UNIT AND AN EXPOSURE APPARATUS USING THE UNIT

BACKGROUND OF THE INVENTION

1. Field of the Invention

This invention relates to a mirror unit (reflecting-mirror unit), for utilizing X-rays or the like having a short wavelength, in an exposure apparatus, which is used for manufacturing semiconductor integrated circuits or the like, and an exposure apparatus including the mirror unit.

2. Description of the Related Art

Among X-ray exposure apparatuses for exposing a resist, coated on a wafer and provided in the proximity of a pattern on a mask, with X-rays emanating from an illuminating light source, apparatuses which utilize synchrotron orbit radiation (SOR) light as an X-ray light source have been proposed.

The synchrotron radiation light is obtained from an SOR apparatus which emits light on an orbital plane of electrons. While the light from the SOR apparatus has a large beam path in a direction parallel to the orbital plane of the electrons, the light has a very small spread, such that the divergence angle of the light is approximately a few mrad (milliradians), in a direction perpendicular to the orbital plane of the electrons. Accordingly, in order to obtain an exposure region of a few centimeters, which is required for an exposure apparatus, the synchrotron radiation light must be spread in the direction perpendicular to the orbital plane of the electrons. Various methods have been proposed for that purpose. In one method, a plane mirror swings around an axis perpendicular to the direction of the radiation light and parallel to the orbital plane of the electrons. In another method, reflected light is spread in a direction perpendicular to the orbital plane of the electrons by a convex mirror.

A conventional mirror supporting device in a method of obtaining an exposure region using a convex mirror is disclosed in Japanese Patent Laid-open Application (Kokai) No. 5-100096 (1993) filed by the assignee of the present application.

FIG. 13 is a partially-cutaway schematic perspective view of a conventional exposure apparatus. FIG. 14 is an enlarged cross-sectional view of a mirror unit shown in FIG. 13.

As shown in FIGS. 13 and 14, a supporting plate 103, on which a mirror 101 is mounted via a mirror holder 102, is provided within a vacuum chamber 100, so that the entire mirror 101 is provided within the vacuum chamber 100. The supporting plate 103 has a threaded hole 104, and is supported on a mirror supporter 107, which is present outside the vacuum chamber 100, via an internal flange 111, and a supporting rod 106 including an exhaust port 109. The internal flange 111 is connected to the vacuum chamber 100 via a bellows 105, and the mirror supporter 102 is supported on the supporting plate 103 using bolts (not shown). The mirror supporter 107 is positioned by being driven by a driving motor 117, and the tilt of the mirror supporter 107 is adjusted by a tilting plate 116 provided on a reference frame 115. Reference numeral 118 represents a guide for guiding the mirror supporter 107, and reference numerals 119a and 119b represent adjusting screws for finely adjusting the tilt of the mirror supporter 107. A pipe 108 for cooling the mirror is inserted within the supporting rod 106. The pipe 108 for cooling the mirror communicates with a cooling channel 112 formed in the mirror holder 102. Reference numeral 113 represents an O-ring for sealing a connecting portion between the pipe 108 for cooling the mirror and the cooling channel 112.

In order to prevent attenuation of synchrotron radiation light, the mirror 101 is provided in a vacuum. While light having longer wavelengths of light incident upon the mirror 101 is reflected by the mirror 101, light having shorter wavelengths is absorbed by the mirror 101, and the energy of the light is converted into heat. The temperature of the mirror 101 is raised by the heat, and the shape of the reflecting surface of the mirror 101 is deformed by thermal expansion, thereby causing uneven exposure. Accordingly, cooling means, comprising the pipe 108 for cooling the mirror, the cooling channel 112 and the like, is provided for the mirror 101 in order to conduct the heat to the outside. The cooling channel 112 is doubly sealed in order to prevent cooling water from leaking into the vacuum. The mirror 101 is indirectly cooled by cooling the mirror holder 102, which includes the cooling channel 112. Since the interface between the mirror holder 102 and the mirror 101 is in the vacuum, thermal contact resistance is produced.

However, the above-described conventional approach has the following problems. That is, in order to cool the mirror provided within the vacuum chamber, it is necessary to provide the mirror holder, in which the cooling channel for circulating cooling water is provided, and the cooling-water pipe (the pipe for cooling the mirror) within the vacuum chamber. In order to facilitate positioning of the mirror, the mirror is coupled together with the mirror holder, on which the mirror is mounted. Accordingly, every time the mirror is exchanged, the pipe for cooling the mirror must be connected within the vacuum chamber. This causes very inferior operability for exchanging the mirror, and provides for inferior operability overall.

Since leakage of cooling water within the vacuum chamber greatly degrades the degree of vacuum of the vacuum chamber, sufficient countermeasures must be provided in order to prevent leakage of the cooling water. As a result, the configuration of the vacuum chamber becomes complicated, thereby impairing the ease of maintenance and increasing the cost of the apparatus.

In addition, an interface between the mirror and the cooling member (mirror holder) within the vacuum chamber produces thermal contact resistance, thereby reducing the cooling efficiency. Accordingly, there is room for improving the cooling efficiency.

SUMMARY OF THE INVENTION

The present invention has been made in consideration of the above-described problems.

It is an object of the present invention to provide a mirror unit having a small size, an excellent cooling efficiency, ease of exchange, and an excellent maintenance capability, and an exposure apparatus which includes the mirror unit.

According to one aspect, the present invention, which achieves the above-described object, relates to a mirror unit, comprising a mirror having a reflecting surface, a holding member for supporting the mirror and an airtight chamber incorporating the mirror, supported by the holding member, in an airtight state. One of the mirror and the holding member constitutes a portion of a side wall of the airtight chamber.

The mirror unit can be suitably used in an exposure apparatus which uses a synchrotron radiation light source or the like as a light source.

According to another aspect, the present invention relates to an exposure apparatus, comprising a light source for generating a radiation beam, a mirror unit including a mirror for reflecting the radiation beam, and an exposure unit for exposing a substrate with the reflected radiation beam. The mirror unit comprises a mirror having a reflecting surface, a holding member for supporting the mirror and an airtight chamber incorporating the mirror, supported by the holding member, in an airtight state. One of the mirror and the holding member constitutes a portion of a side wall of the airtight chamber.

The foregoing and other objects, advantages and features of the present invention will become more apparent from the following description of the preferred embodiments taken in conjuction with the accompanying drawings.

DESCRIPTION OF THE PREFERRED EMBODIMENTS

Preferred embodiments of the present invention will now be described with reference to the drawings.

FIRST EMBODIMENT

Figure 1:
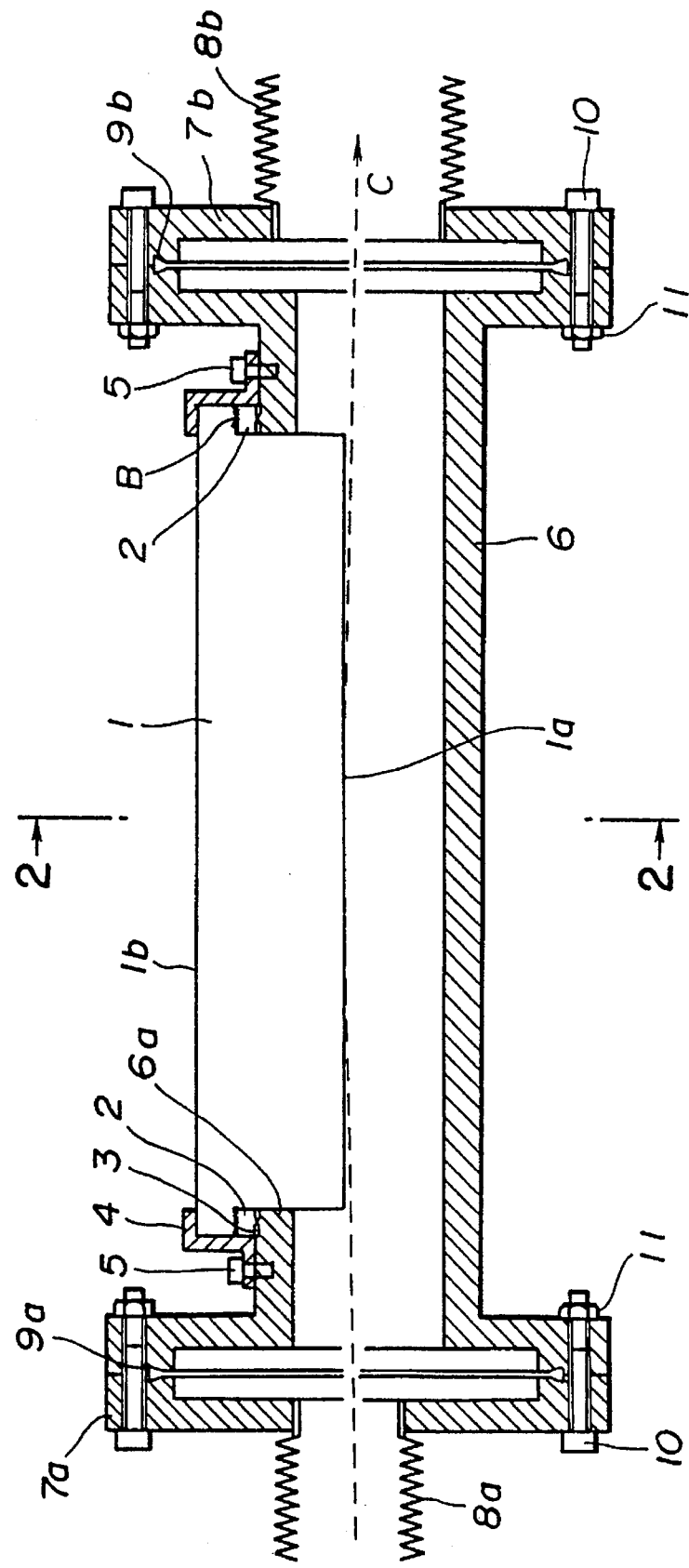
FIG. 1 is a vertical cross-sectional view illustrating a mirror unit according to a first embodiment of the present invention.
Figure 2:
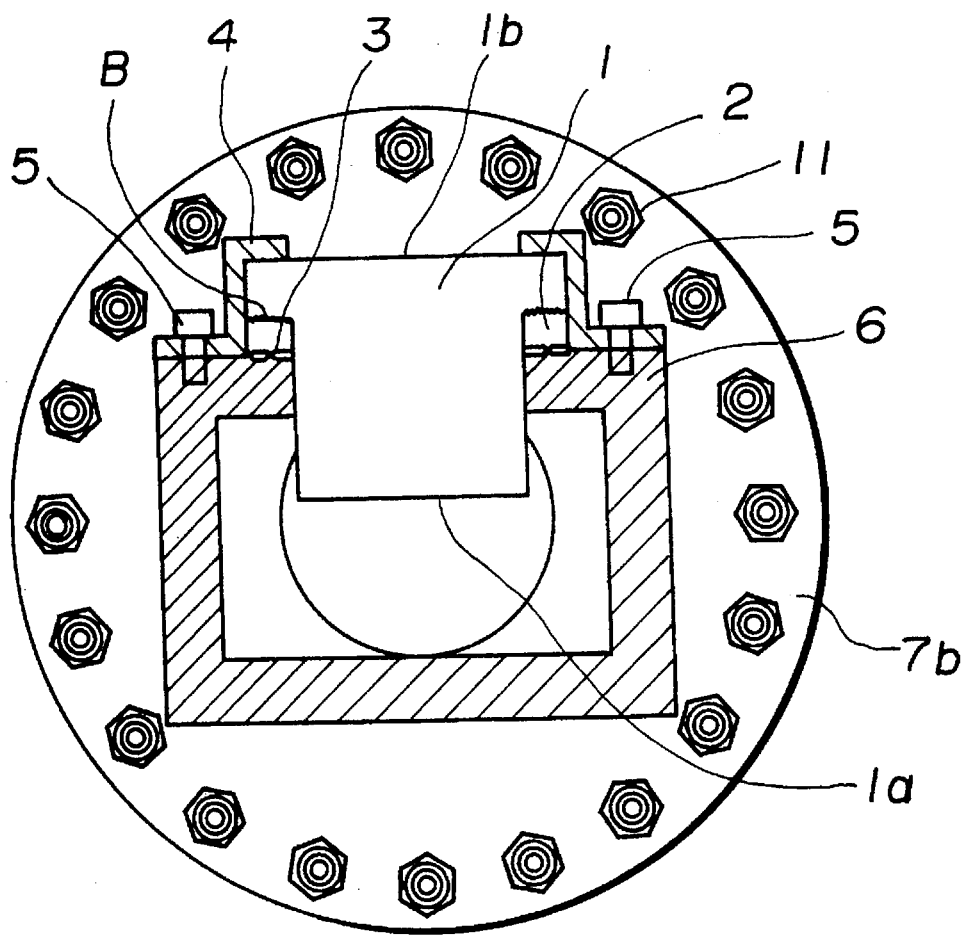
FIG. 2 is a cross-sectional view taken along line A—A shown in FIG. 1.

FIG. 1 is a vertical cross-sectional view illustrating a reflecting mirror unit according to a first embodiment of the present invention. FIG. 2 is a cross-sectional view taken along line A—A shown in FIG. 1.

As shown in FIG. 1, the present embodiment relates to a mirror unit (mirror chamber) for supporting a (reflecting) mirror 1, provided in the optical path of sheet-shaped synchrotron radiation light C, indicated by a broken-line arrow, between a synchrotron ring (not shown), serving as a light source, and a semiconductor exposure apparatus utilizing synchrotron radiation light (not shown), for spreading the synchrotron radiation light C in a direction perpendicular to the sheet plane of the synchrotron radiation. The inside of a chamber (also called a beam line) 6 for providing the optical path of the synchrotron radiation light C is maintained in a vacuum. FIG. 1 is the cross-sectional view of the mirror chamber taken along the optical axis of the synchrotron radiation light C.

As shown in FIGS. 1 and 2, a front portion of the chamber 6 is connected to the synchrotron ring via a front flange 7a and a bellows 8a. A rear portion of the chamber 6 is connected to the exposure apparatus via a rear flange 7b and a bellows 8b, so that illuminating light is guided to the main body of the exposure apparatus. The front flange 7a and the rear flange 7b are fixed to the chamber 6 by a plurality of flange fixing bolts 10 and flange fixing nuts 11 via ring gaskets 9a and 9b for vacuum sealing, respectively. According to this configuration, the inside of the chamber 6 is maintained in an ultrahigh or high vacuum state.

An opening 6a for mounting the mirror 1 is formed in a side of the chamber 6. The mirror 1 is disposed in the opening 6 such that a reflecting surface 1a of the mirror 1 is inside the chamber 6 (downward in FIG. 1). The back 1b of the mirror 1 is exposed to the outside (in the atmosphere). In order to spread the sheet-shaped synchrotron radiation light C in a direction perpendicular to the sheet plane of the synchrotron radiation, the reflecting surface 1a of the mirror 1 has the shape of a portion of a cylinder having a radius of about 100 m, so that the circumferential direction of the cylinder has an incident angle of about 10 mrad with respect to the optical axis of the synchrotron radiation light C. The cross section of the mirror 1 has the general shape of a block T. A frame 2 is fixed to the shoulder portions of the block T-shaped mirror 1 by a method capable of maintaining airtightness, such as brazing (see brazed portions B). The frame 2 has the shape of a plate having an opening capable of passing the mirror 1 through in its central portion. Annular edges (projections) for pressing a gasket 3 for vacuum sealing are formed on a surface opposite to the surface fixed to the mirror 1. The same annular edges (projections) as the annular edges of the frame 2 are formed on a surface of the chamber 6 at positions facing the edges of the frame 2. By compressing the gasket 3 by the edges formed on the surfaces of the chamber 6 and the frame 2, vacuum sealing is assured. In order to fix the mirror 1 to the chamber 6, and to press the gasket 3 so as to be sufficient for vacuum sealing, a mirror fixing member 4, serving as a frame-shaped mirror holding member, is fastened to the chamber 6 by a plurality of bolts 5. The mirror fixing member 4 is made of a relatively soft frame-shaped material, such as a plastic or the like, so as not to deform the reflecting surface 1a of the mirror 1 by an unbalanced force applied thereto.

The mirror unit having the above-described configuration is disposed in the beam line between the synchrotron ring and the exposure apparatus so as to guide the radiation light to the exposure apparatus present at the downstream side while spreading the radiation light in a direction perpendicular to the sheet plane of the synchrotron radiation by the mirror 1. The relative position between the reflecting surface 1a of the mirror 1 and the radiation light is precisely aligned by driving the entire chamber 6 by a position-adjusting mechanism (not shown). It is possible to precisely align the reflecting surface 1a making the back 1b a reference by precisely measuring the shape of the mirror 1 before disposing the mirror 1 in the chamber 6. The relative movement of the chamber 6 with respect to the beam line during the alignment can be absorbed by the bellows 8a and 8b.

While light having longer wavelengths of the radiation light is reflected by the reflecting surface 1a of the mirror 1, light having shorter wavelengths of the radiation light is absorbed by the mirror 1. The energy of the absorbed light is converted into heat, which is conducted through the mirror 1 and is radiated into the atmosphere from the back 1b of the mirror 1 exposed to the atmosphere. If the heat cannot be sufficiently radiated only by atmospheric cooling, a cooling-water channel may be formed in the back or the inside of the mirror 1, and cooling water may be circulated therein.

If the reflecting surface 1a of the mirror 1 is damaged, the mirror 1 must be exchanged. When exchanging the mirror 1, the connected member comprising the mirror 1 and the frame 2 is exchanged. That is, the mirror fixing member 4 is first detached from the chamber 6, and then the connected member comprising the mirror 1 and the frame 2 is detached from the chamber 6. After replacing the gasket 3 with a new one, a new connected member comprising a mirror 1 and a frame 2 is fixed to the chamber 6 by the mirror fixing member 4. Thus, the exchange of the mirror 1 is completed. By previously providing a connected member comprising a mirror 1 and a frame 2 for exchange, the time required for the exchange can be shortened.

According to the above-described configuration, since it is only necessary to provide a space for passing incident light and reflected light within the mirror chamber, it is possible to reduce the volume of the mirror chamber and to reduce the surface area of the inside of the chamber. As a result, only a relatively small evacuation capability is required for an evacuation system.

In order to prevent the shape of the reflecting surface 1a of the mirror 1 from being deformed by heat, brazing of the mirror 1 and the frame 2 is performed before polishing the reflecting surface 1a. After the brazing, the surface of the mirror 1 is polished so as to provide a cylindrical surface. Although in the above-described embodiment the mirror 1 is fixed to the frame 2 by brazing, the mirror 1 may be fixed to the frame 2 by any other method provided that vacuum sealing can be realized. Although in the above-described embodiment a gasket is used for performing vacuum sealing, an O-ring may also be used.

SECOND EMBODIMENT

Figure 3:
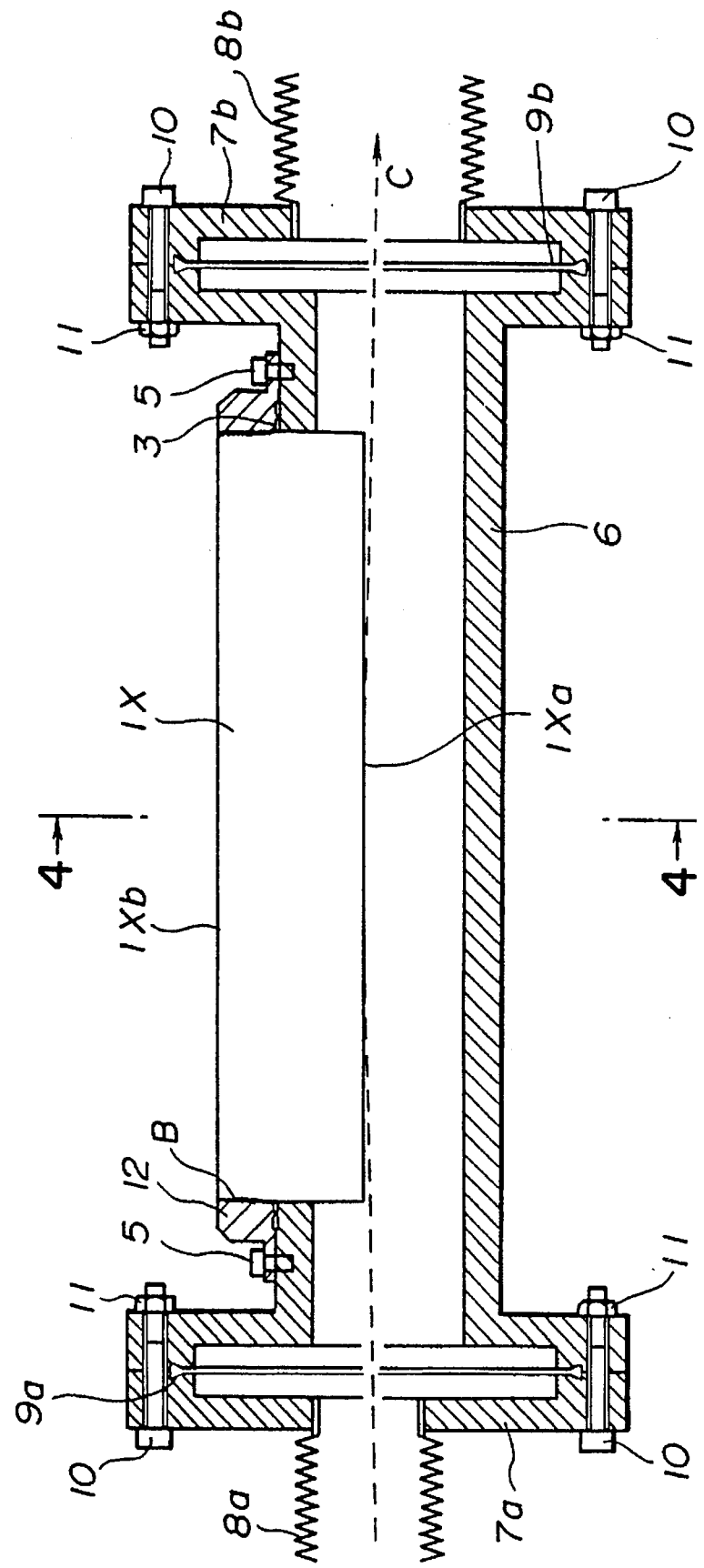
FIG. 3 is a vertical cross-sectional view illustrating a mirror unit according to a second embodiment of the present invention.
Figure 4:
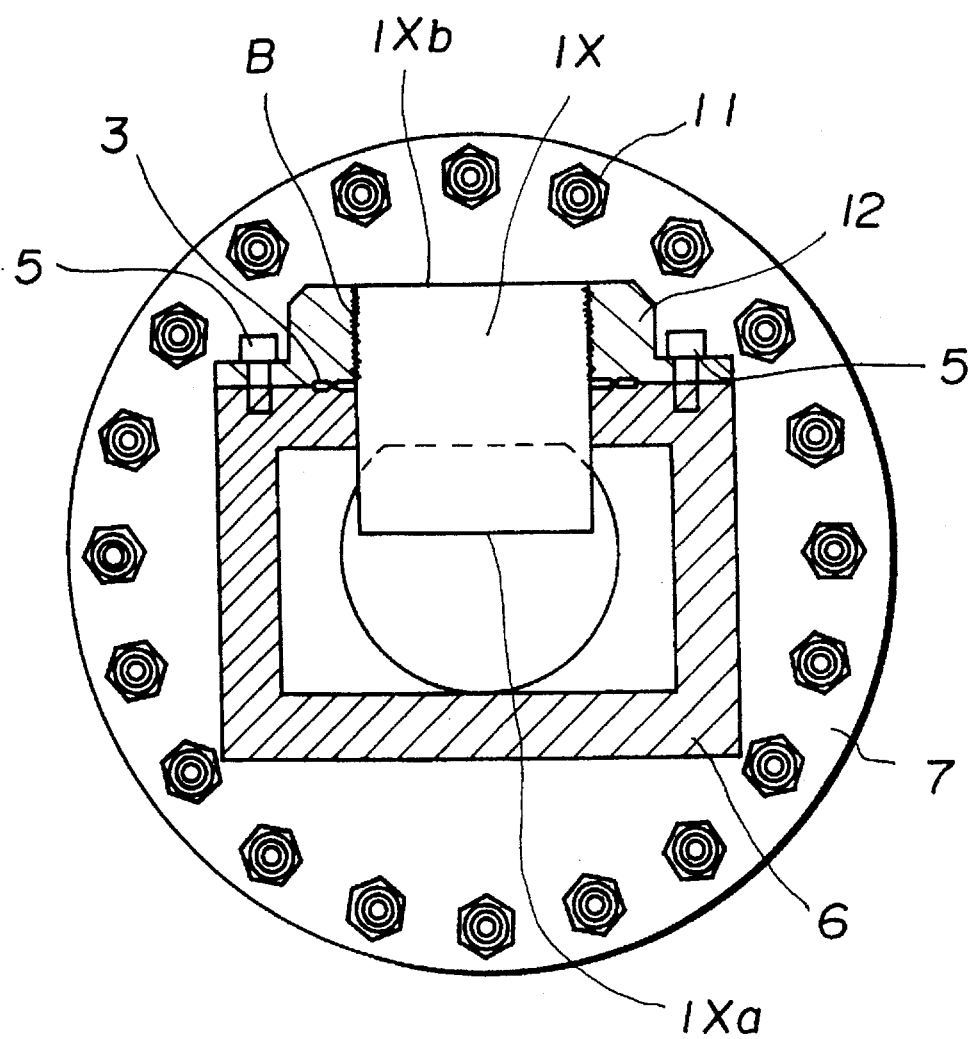
FIG. 4 is a cross-sectional view taken along line A—A shown in FIG. 3.

FIG. 3 is a vertical cross-sectional view ilustrating a mirror unit according to a second embodiment of the present invention. FIG. 4 is a cross-sectional view taken along line A—A shown in FIG. 3.

As with the above-described first embodiment, the present embodiment relates to a mirror chamber for supporting a mirror, provided in the optical path of sheet-shaped synchrotron radiation light between a synchrotron ring, serving as a light source, and a semiconductor exposure apparatus utilizing synchrotron radiation light (not shown), for spreading the synchrotron radiation light in a direction perpendicular to the sheet plane of the synchrotron radiation by a cylindrical reflecting surface of the mirror.

In FIGS. 3 and 4, the same components as those shown in FIGS. 1 and 2 are indicated by the same reference numerals, and a description will be omitted for components described in the first embodiment.

As shown in FIGS. 3 and 4, a reflecting surface 1Xa of a mirror 1X has the shape of a portion of a cylinder having a radius of about 100 m so as to spread a sheet-shaped light beam in a direction perpendicular to the sheet plane of the synchrotron radiation. A mirror holding member (mirror mounting flange) 12 is fixed to side portions of the mirror 1X by means of brazing or the like so as to be integral with the mirror 1X (see brazed portions B). Brazing is performed so as to prevent leakage in order to maintain a vacuum within the chamber 8. The connected member comprising the mirror 1X and the mirror holding member 12 is disposed in the opening of the chamber 6 so that the reflecting surface 1Xa of the mirror 1X is present inside the chamber 6. In order to provide the chamber 6 with airtightness, annular edges for vacuum sealing are formed on a surface of the mirror holding member 12. By compressing the gasket 3 between the above-described edges and edges formed along the opening of the chamber 6 at positions facing the edges of the mirror holding member 12, vacuum sealing is assured. The mirror 1X is fixed to the chamber 6 by uniformly fastening the mirror holding member 12 along a circumference outside the sealed surface by a plurality of bolts 5.

The mirror unit having the above-described configuration is disposed in the beam line between the synchrotron ring and the exposure apparatus so as to guide the radiation light to the exposure apparatus present at the downstream side while spreading the radiation light in a direction perpendicular to the sheet plane of the synchrotron radiation by the mirror 1X. The relative position between the reflecting surface 1Xa of the mirror 1X and the radiation light is precisely aligned by driving the entire chamber 6 by a position-adjusting mechanism (not shown). It is possible to precisely align the reflecting surface 1Xa making the back 1Xb a reference by precisely measuring the shape of the mirror 1X before disposing the mirror 1X in the chamber 6. The relative movement of the chamber 6 with respect to the beam line during the alignment can be absorbed by the bellows 8a and 8b.

While light having longer wavelengths of the radiation light is reflected by the reflecting surface 1Xa of the mirror 1X, light having shorter wavelengths of the radiation light is absorbed by the mirror 1X. The energy of the absorbed light is converted into heat, which is conducted through the mirror 1X and is radiated into the atmosphere from the back 1Xb of the mirror 1X exposed to the atmosphere. If the heat cannot be sufficiently radiated only by atmospheric cooling, a cooling-water channel may be formed in the back 1Xb or the inside of the mirror 1X, and cooling water may be circulated therein.

If the reflecting surface 1Xa of the mirror 1X is damaged, the mirror 1X must be exchanged. When exchanging the mirror 1X, the connected member comprising the mirror 1X and the mirror holding member 12 integrated by brazing is exchanged. That is, the connected member comprising the mirror 1X and the mirror holding member 12 is first detached by removing the fixing bolts 5, the gasket 3 is then exchanged, and a new connected member comprising a mirror 1X and a mirror holding member 12 is fixed to the chamber 6 by the fixing bolts 5. Thus, the exchange of the mirror 1X is completed. By previously providing a connected member comprising a mirror 1X and a mirror holding member 12 for exchange, the time required for the exchange can be shortened.

According to the above-described configuration, since it is only necessary to provide a space for passing incident light and reflected light within the mirror chamber, it is possible to reduce the volume of the mirror chamber and to reduce the surface area of the inside of the chamber. As a result, only a relatively small evacuation capability is required for an evacuation system.

In order to prevent the shape of the reflecting surface 1Xa of the mirror 1X from being deformed by heat, brazing of the mirror 1X and the mirror holding member 12 is performed before polishing the reflecting surface 1Xa. After the brazing, the surface of the mirror 1X is polished so as to provide a cylindrical surface. Although in the above-described embodiment the mirror 1X is fixed to the mirror holding member 12 by brazing, the mirror 1X may be fixed to the mirror holding member 12 by any other method provided that vacuum sealing can be realized. Although in the above-described embodiment a gasket is used for performing vacuum sealing, an O-ring may also be used.

THIRD EMBODIMENT

Figure 5:
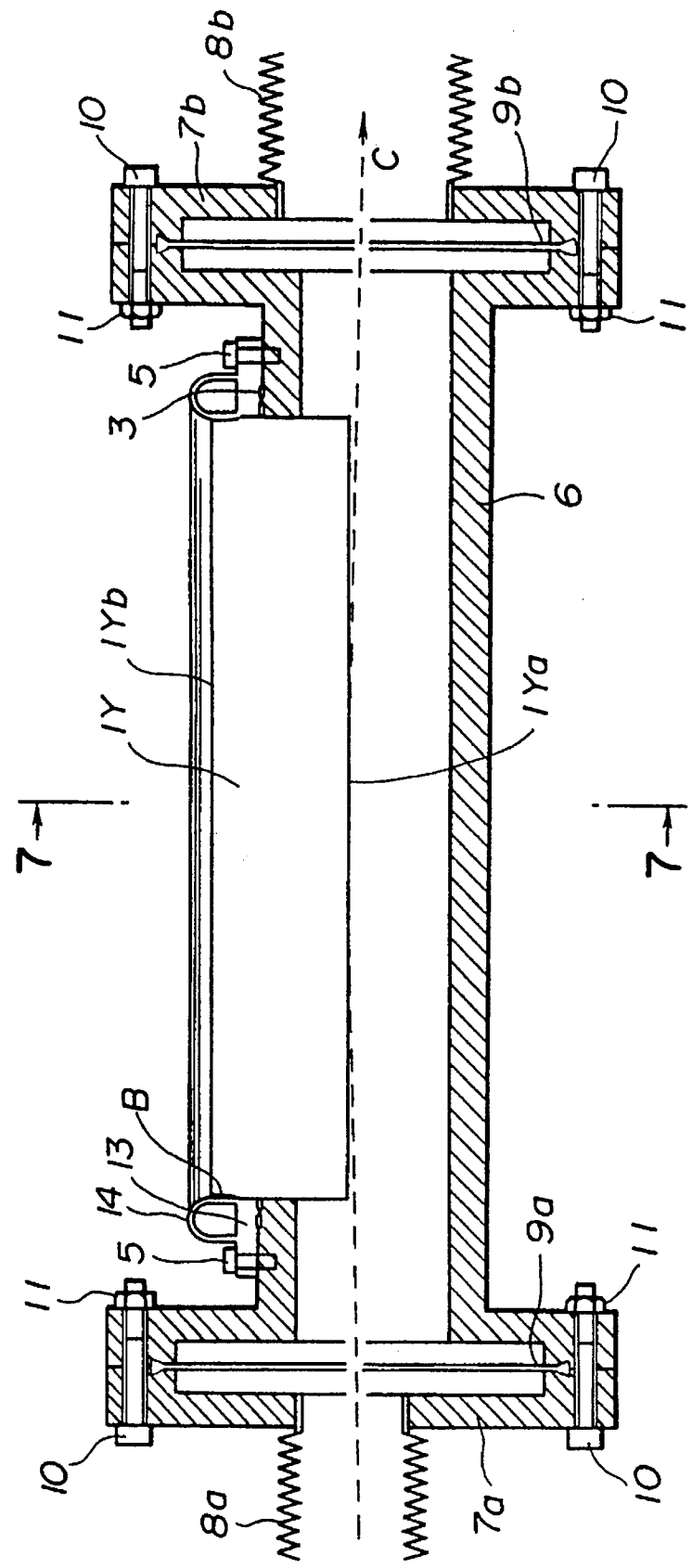
FIG. 5 is a vertical cross-sectional view illustrating a mirror unit according to a third embodiment of the present invention.
Figure 6:
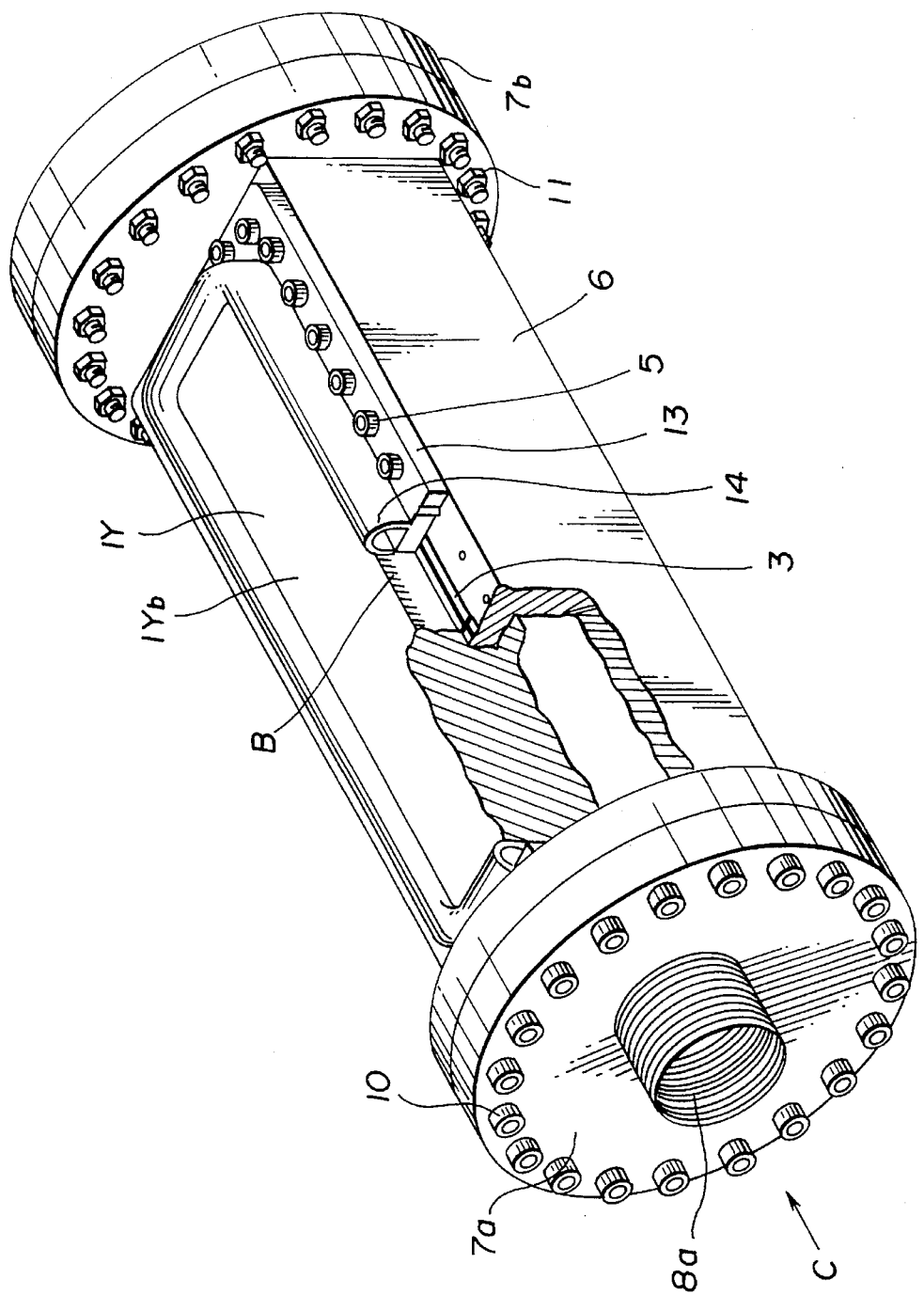
FIG. 6 is a partially-cutaway perspective view of the mirror unit shown in FIG. 5.
Figure 7A:
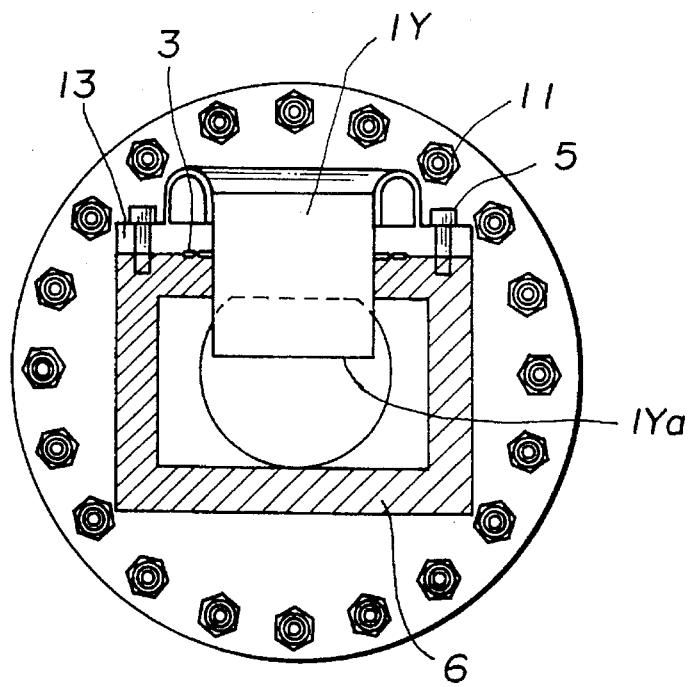
FIG. 7(a) is a cross-sectional view taken along line A—A shown in FIG. 5.
Figure 7B:
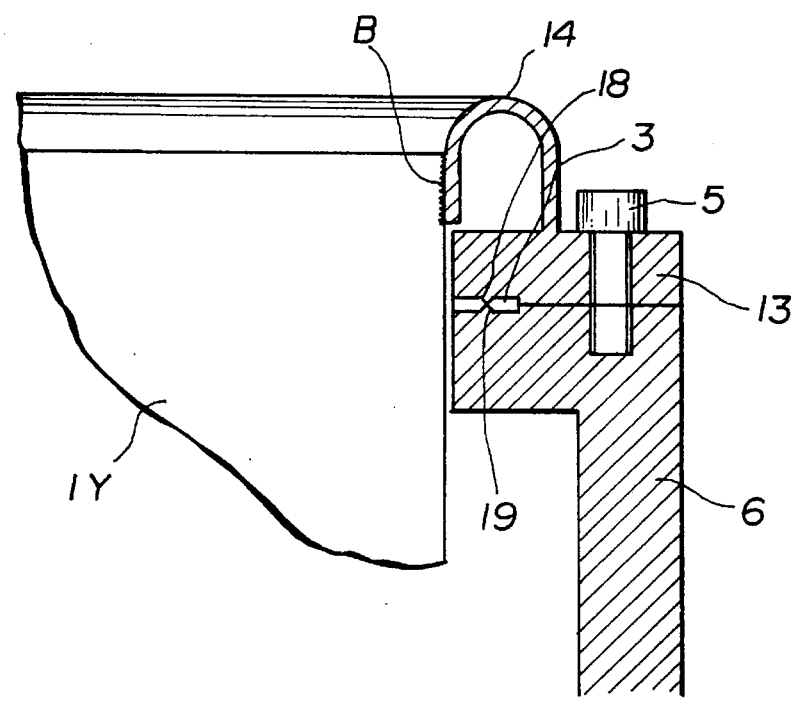
FIG. 7(b) is an enlarged cross-sectional view illustrating a connecting portion between a mirror and a mirror holding member.

FIG. 5 is a vertical cross-sectional view illustrating a mirror unit according to a third embodiment of the present invention. FIG. 6 is a partially-cutaway perspective view of the mirror unit shown in FIG. 5. FIG. 7(a) is a cross-sectional view taken along line A—A shown in FIG. 5. FIG. 7(b) is an enlarged cross-sectional view illustrating a connected portion between a mirror and a mirror holding member.

As the above-described first embodiment, the present embodiment relates to a mirror chamber for supporting a mirror, provided in the optical path of sheet-shaped synchrotron radiation light C between a synchrotron ring, serving as a light source, and a semiconductor exposure apparatus utilizing synchrotron radiation light (not shown), for spreading the synchrotron radiation light C in a direction perpendicular to the sheet plane of the synchrotron radiation by a cylindrical reflecting surface of the mirror. The inside of the chamber for providing the optical path of the synchrotron radiation light C is maintained in a vacuum.

In FIGS. 5 through 7(b), the same components as those shown in FIGS. 1 and 2 are indicated by the same reference numerals, and a description will be omitted for components described in the first embodiment.

As shown in FIGS. 5 through 7(b), a reflecting surface 1Ya of a mirror 1Y has the shape of a portion of a cylinder having a radius of about 100 m so as to spread a sheet-shaped light beam in a direction perpendicular to the sheet plane of the synchrotron radiation. A mirror holding member 13 is fixed to side portions of the mirror 1Y by means of brazing so as to be integral with the mirror 1Y (see brazed portions B). Brazing is performed so as not to provide leakage in order to maintain a vacuum within the chamber 6. Portions of the mirror holding member 13 brazed to the mirror 1Y provide an arch-shaped spring structure. The arch portion 14 absorbs deformation generated when the fastening force of the fixing bolts 5 for fixing the mirror holding member 13 to the chamber 6 is non-uniform, to prevent the reflecting surface 1Ya of the mirror 1Y from being deformed. The mirror holding member 13 is disposed in the opening of the chamber 6 so that the reflecting surface 1Ya of the mirror 1Y is present inside the chamber 6. In order to provide the chamber 6 with airtightness, annular edges 18 (see FIG. 7(b)) for vacuum sealing are formed on a surface of the mirror holding member 13. By compressing the gasket 3 between the above-described edges and edges 19 (see FIG. 7(b)) formed along the opening of the chamber 6 at positions facing the edges of the mirror holding member 13, vacuum sealing is assured. The mirror 1Y is fixed to the chamber 8 by fastening the mirror holding member 13 by fixing bolts 5.

The mirror unit having the above-described configuration is disposed in the beam line between the synchrotron ring and the exposure apparatus so as to guide the radiation light to the exposure apparatus present at the downstream side while spreading the radiation light in a direction perpendicular to the sheet plane of the synchrotron radiation by the mirror 1Y. The relative position between the reflecting surface 1Ya of the mirror 1Y and the radiation light is precisely aligned by driving the entire chamber 6 by a position-adjusting mechanism (not shown). It is possible to precisely align the reflecting surface 1Ya making the back 1Yb a reference by precisely measuring the shape of the mirror 1Y before disposing the mirror 1Y in the chamber 6. The relative movement of the chamber 6 with respect to the beam line during the alignment can be absorbed by the bellows 8a and 8b. The position of the mirror 1Y changes due to the deformation of the arch portion 14 depending on whether the inside of the chamber 6 is maintained in a vacuum or exposed to the atmosphere. Accordingly, the mirror 1Y must be positioned while maintaining the inside of the chamber 6 in a vacuum.

While light having longer wavelengths of the radiation light is reflected by the reflecting surface 1Ya of the mirror 1Y, light having shorter wavelengths of the radiation light is absorbed by the mirror 1Y. The energy of the absorbed light is converted into heat, which is conducted through the mirror 1Y and is radiated into the atmosphere from the back 1Yb of the mirror 1Y, which is exposed to the atmosphere. If the heat cannot be sufficiently radiated only by atmospheric cooling, a cooling-water channel may be formed in the back 1Yb or the inside of the mirror 1Y, and cooling water may be circulated therein.

If the reflecting surface 1Ya of the mirror 1Y is damaged, the mirror 1Y must be exchanged. When exchanging the mirror 1Y, the connected member comprising the mirror 1Y and the mirror holding member 13 integrated by brazing is exchanged. That is, the connected member comprising the mirror 1Y and the mirror holding member 13 is first detached by removing the fixing bolts 5, the gasket 3 is then exchanged, and a new connected member comprising a mirror 1Y and a mirror holding member 13 is fixed to the chamber 6 by the fixing bolts 5. Thus, the exchange of the mirror 1X is completed. By previously providing a connected member comprising a mirror 1Y and a mirror holding member 13 for exchange, the time required for the exchange can be shortened.

According to the above-described configuration, since it is only necessary to provide a space for passing incident light and reflected light within the mirror chamber, it is possible to reduce the volume of the mirror chamber and to reduce the surface area of the inside of the chamber. As a result, only a small evacuation capability is required for an evacuation system.

In order to prevent the shape of the reflecting surface 1Ya of the mirror 1Y from being deformed by heat, brazing of the mirror 1Y and the mirror holding member 13 is performed before polishing the reflecting surface 1Ya. After the brazing, the surface of the mirror 1Y is polished so as to provide a cylindrical surface. Although in the above-described embodiment the mirror 1Y is fixed to the mirror holding member 13 by brazing, the mirror 1Y may be fixed to the mirror holding member 13 by any other method provided that vacuum sealing can be realized. Although in the above-described embodiment a gasket is used for performing vacuum sealing, an O-ring may also be used.

FOURTH EMBODIMENT

Figure 8:
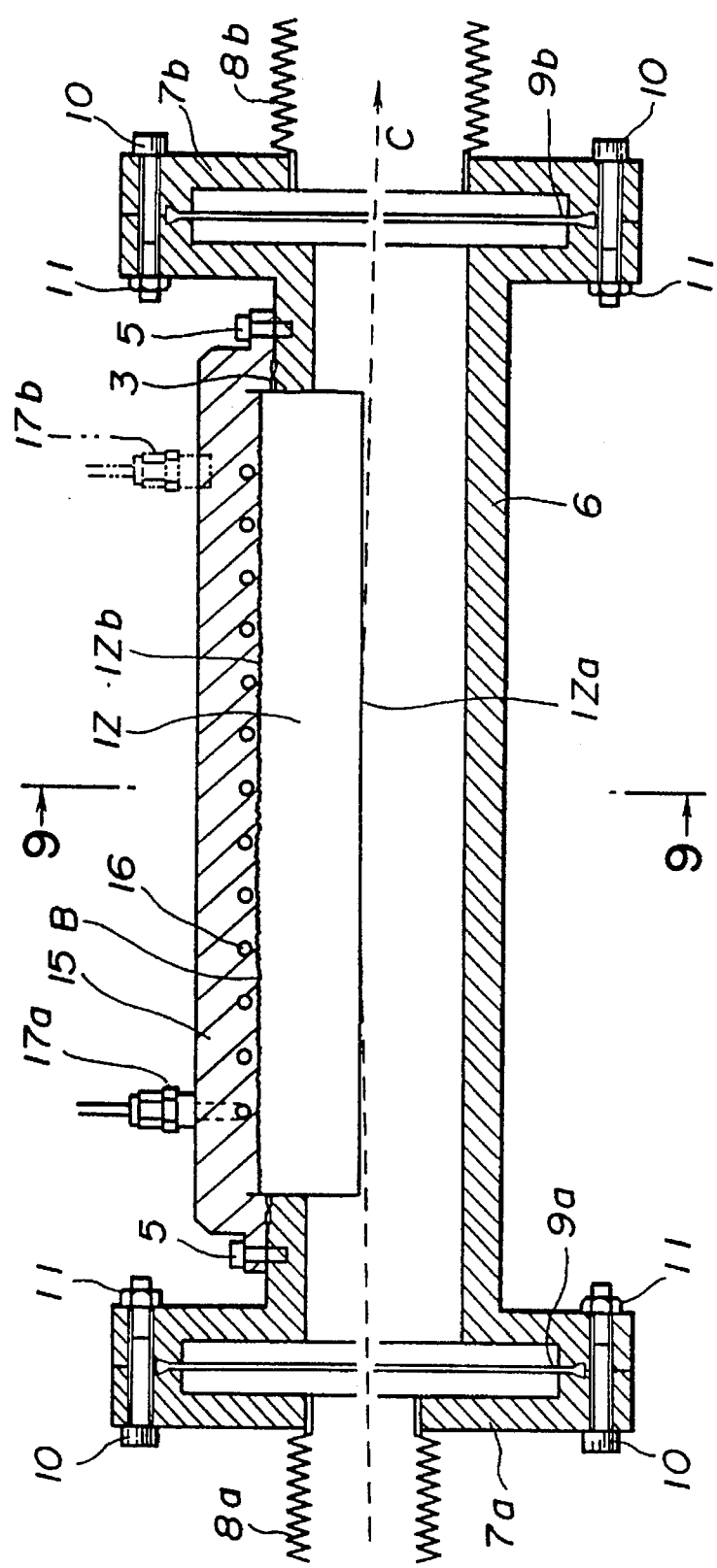
FIG. 8 is a vertical cross-sectional view illustrating a mirror unit according to a fourth embodiment of the present invention.
Figure 9:
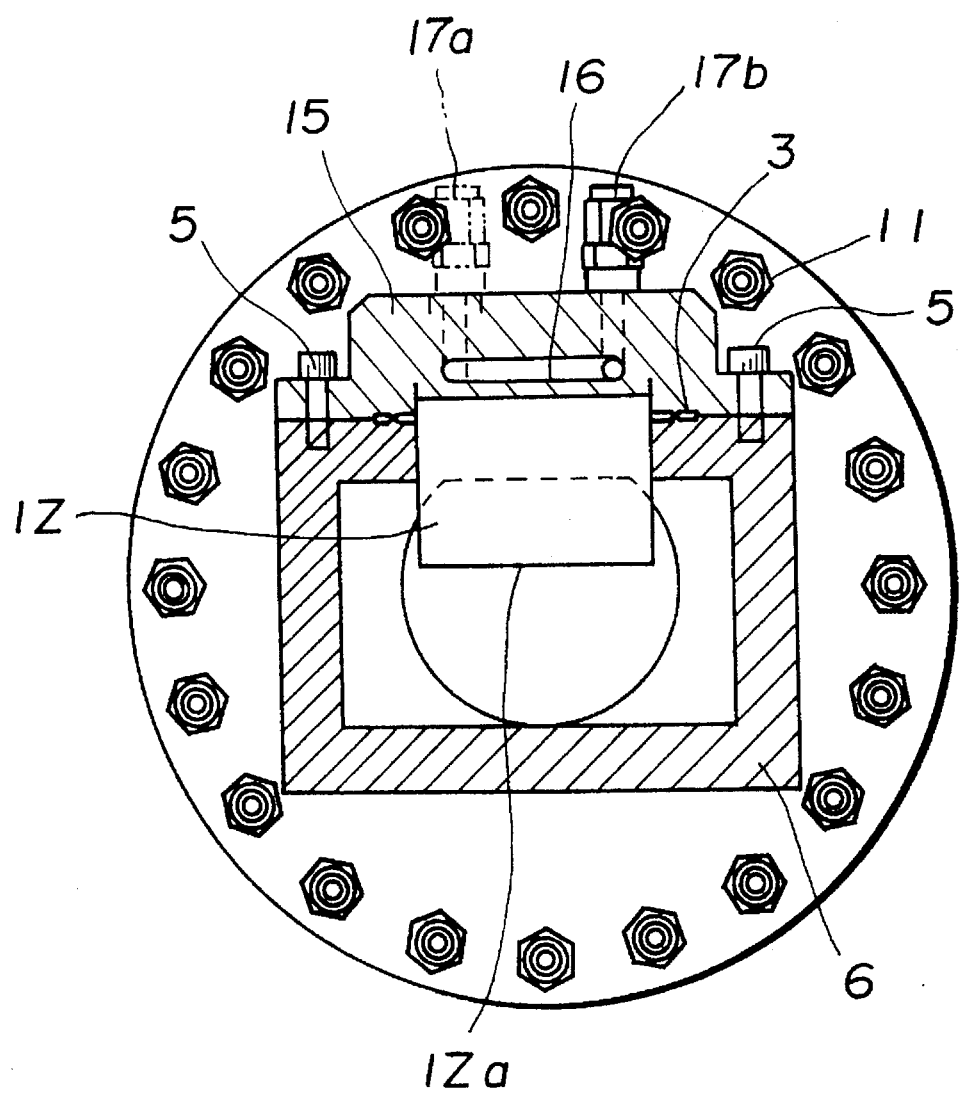
FIG. 9 is a cross-sectional view taken along line A—A shown in FIG. 8.
Figure 10:
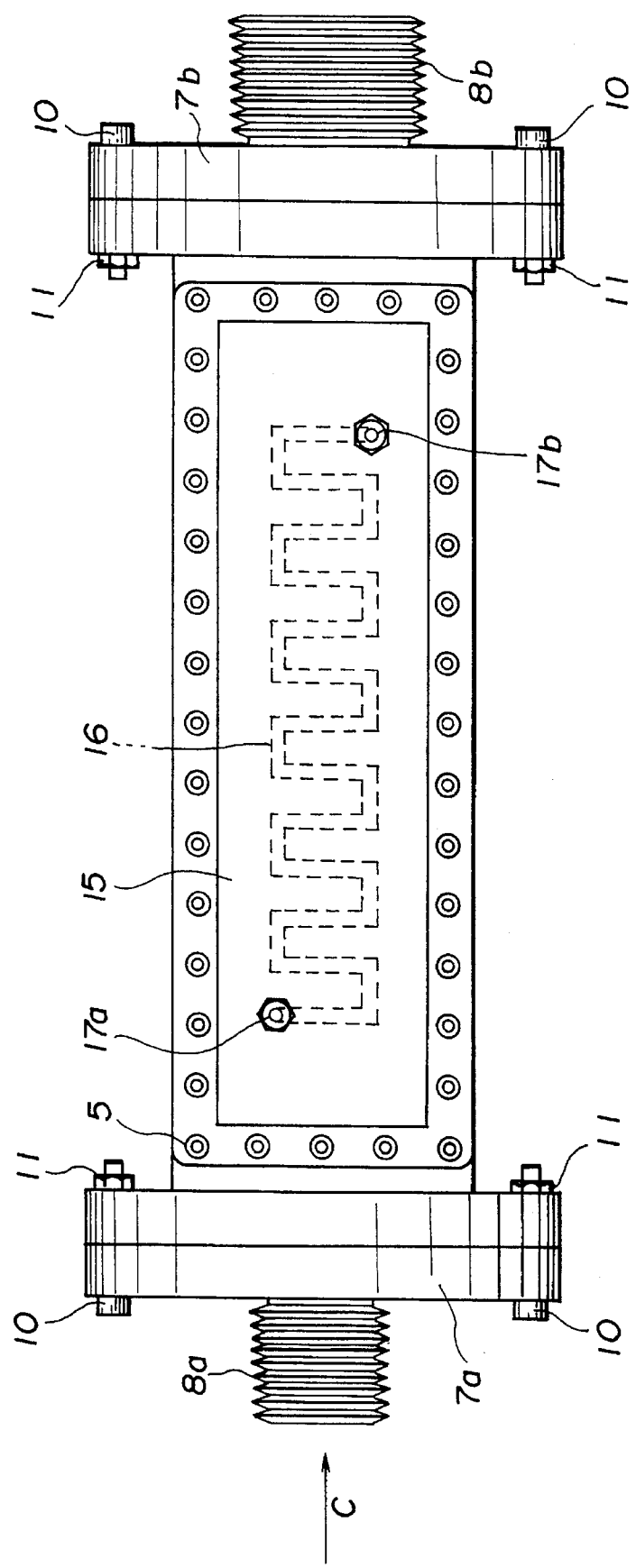
FIG. 10 is a top plan view of the mirror unit shown in FIG. 8.

FIG. 8 is a vertical cross-sectional view of a mirror unit according to a fourth embodiment of the present invention. FIG. 9 is a cross-sectional view taken along line A—A shown in FIG. 8. FIG. 10 is a top plan view of the mirror unit shown in FIG. 8.

As in the above-described first embodiment, the present embodiment relates to a mirror unit for supporting a mirror, provided in the optical path of sheet-shaped synchrotron radiation light C between a synchrotron ring, serving as a light source, and a semiconductor exposure apparatus utilizing synchrotron radiation light (not shown), for spreading the synchrotron radiation light C in a direction perpendicular to the sheet plane of the synchrotron radiation by a cylindrical reflecting surface of the mirror. The inside of the chamber for providing the optical path of the synchrotron radiation light C is maintained in a vacuum.

In FIGS. 8 through 10, the same components as those shown in FIGS. 1 and 2 are indicated by the same reference numerals, and a description will be omitted for components described in the first embodiment.

As shown in FIGS. 8 through 10, a reflecting surface 1Za of a mirror 1Z has the shape of a portion of a cylinder having a radius of about 100 m so as to spread a sheet-shaped light beam in a direction perpendicular to the sheet plane of the synchrotron radiation. The entirety of a back surface 1Zb, opposite to the reflecting surface 1Za, of the mirror 1Z is uniformly fixed to a mirror holding block 15, serving as a mirror holding member, by means of brazing so as to be integral with the mirror holding block 15 (see brazed portions B). The mirror holding block 15 is disposed in the opening of the chamber 6 so that the reflecting surface 1Za of the mirror 1Z is present inside the chamber 6. In order to provide the chamber 6 with airtightness, annular edges for vacuum sealing are formed on a surface of the mirror holding block 15. By compressing the gasket 3 between the above-described edges and edges formed along the opening of the chamber 6 at positions facing the edges of the mirror holding block, vacuum sealing is assured. The mirror 1Z is fixed to the chamber 6 by fastening the mirror holding block 15 by fixing bolts 5. In order to prevent the generation of a non-uniform force to deform the mirror holding block 15 and to distort the reflecting surface 1Za of the mirror 1Z when fastening the mirror holding block 15 by the fixing bolts 5, the mirror holding block 15 has a sufficient strength and includes a groove around its surface connected to the mirror 1Z. The back of the mirror holding block 15 is finished to a plane having high accuracy, and is used as a reference for the alignment of the reflecting surface 1Za of the mirror 1Z.

The synchrotron radiation light is reflected by the mirror 1Z, but light having short wavelengths is absorbed by the mirror 1Z and is converted into heat. There is the possibility that the mirror 1Z is deformed by thermal expansion due to the heat. In order to cool the heat absorbed by the mirror 1Z, a (cooling) channel 16 for running cooling water is provided within the mirror holding block 15. The cooling water is guided from a cooling-water inlet 17a into the channel 16 to absorb the heat conducted from the mirror 1Z, and is discharged from a cooling-water outlet 17b. The cooling water is maintained at a constant temperature by a cooling device (not shown).

The mirror unit having the above-described configuration is disposed in the beam line between the synchrotron ring and the exposure apparatus so as to guide the radiation light to the exposure apparatus present at the downstream side while spreading the radiation light in a direction perpendicular to the sheet plane of the synchrotron radiation by the mirror 1Z. The relative position between the reflecting surface 1Za of the mirror 1Z and the radiation light is precisely aligned by driving the entire chamber 6 by a position-adjusting mechanism (not shown). It is possible to precisely align the reflecting surface 1Za making the external surface of the mirror holding block 15 (the side of the mirror chamber exposed to the atmosphere) a reference by precisely measuring the shape of the mirror holding block 15, to which the mirror 1Z is bonded, before disposing the mirror 1Z in the chamber 6. The relative movement of the chamber 6 with respect to the beam line during the alignment can be absorbed by the bellows 8a and 8b. The entire chamber 6 is deformed differently due to the atmospheric pressure depending on whether the inside of the chamber 6 is maintained in a vacuum or exposed to the atmosphere. Accordingly, the mirror 1Z must be positioned while making the inside of the chamber 6 a vacuum when very precise positioning is required.

If the reflecting surface 1Za of the mirror 1Z is damaged, the mirror 1Z must be exchanged. When exchanging the mirror 1Z, the connected member comprising the mirror 1Z and the mirror holding block 15 integrated by brazing is exchanged. That is, the connected member comprising the mirror 1Z and the mirror holding block 15 is first detached from the chamber 6 by removing the fixing bolts 5, cooling pipes (not shown) are then detached from the cooling-water inlet 17a and the cooling-water outlet 17b, pipes are mounted in a connected member comprising a new mirror 1Z and a new mirror holding block 15, the gasket 3 is exchanged, and the new connected member comprising the mirror 1Z and the mirror holding block 15 is fixed to the chamber 6 by the fixing bolts 5. Thus, the exchange of the mirror 1Z is completed. Since it is unnecessary to perform an operation of mounting pipes for cooling water within the mirror chamber, cooling water leaking within the chamber 6 during the mounting operation will be prevented. By previously providing a connected member comprising a mirror 1Z and a mirror holding block 15 for exchange, the time required for the exchange can be shortened.

According to the above-described configuration, since it is only necessary to provide a space for passing incident light and reflected light within the mirror chamber, it is possible to reduce the volume of the mirror chamber and to reduce the surface area of the inside of the chamber. As a result, only a small evacuation capability is required for an evacuation system.

In order to prevent the shape of the reflecting surface 1Za of the mirror 1Z from being deformed by heat, brazing of the mirror 1Z and the mirror holding block 15 is performed before polishing the reflecting surface 1Za. After the brazing, the surface of the mirror 1Z is polished so as to provide a cylindrical surface. Although in the above-described embodiment the mirror 1Z is fixed to the mirror holding block 15 by brazing, the mirror 1Z may be fixed to the mirror holding block 15 by any other method provided that vacuum sealing can be realized. Although in the above-described embodiment a gasket is used for performing vacuum sealing, an O-ring may also be used.

Although the present invention has been described illustrating the four embodiments in which synchrotron radiation light is guided to an exposure apparatus using a mirror having a cylindrical reflecting surface while maintaining an exposure atmosphere, the present invention may, of course, be also applied to a mirror-swinging method.

As described above, since heat absorbed by the reflecting surface of the mirror is conducted to the atmosphere without passing through an interface in a vacuum and is cooled, an excellent cooling efficiency is obtained. Since the mirror can be mounted in the chamber in the same manner as mounting a flange, the operability is greatly improved and the mirror can be easily exchanged as compared with the conventional approach in which an operation of mounting the mirror is performed by putting hands within the chamber through a maintenance hole of the chamber. Since no movable unit is present within the chamber and only the reflecting surface off the mirror is exposed within the chamber, the surface area of the chamber is reduced, and therefore an evacuating system having a small evacuating capability can be used. According to the above-described configuration, it is possible to provide a mirror unit having an excellent maintenance capability and a high reliability.

Next, a description will be provided of a method of manufacturing devices utilizing an exposure apparatus having any of the above-described mirror units.

Figure 11:
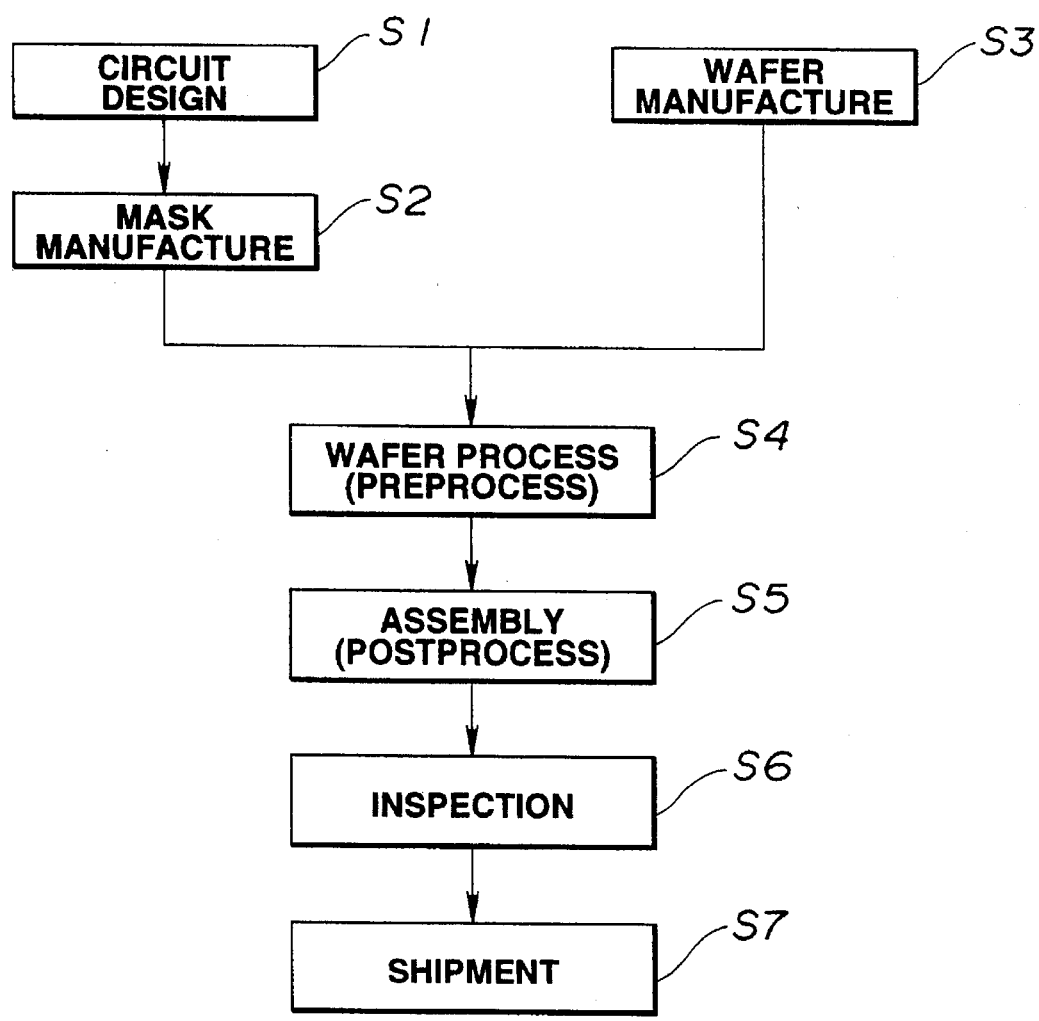
FIG. 11 is a flowchart of a method of manufacturing devices using an exposure apparatus of the present invention.

FIG. 11 is a flowchart for manufacturing minute devices (semiconductor chips of IC's (integrated circuits), LSI's (large-scale integrated circuits) or the like, liquid-crystal panels, CCD's (charge-coupled devices), thin-film magnetic heads, micromachines or the like). In step S1 (circuit design), circuit design of the semiconductor devices is performed. In step S2 (mask manufacture), masks on which designed circuit patterns are formed are manufactured. In step S3 (wafer manufacture), wafers are manufactured using a material, such as silicon or the like. Step S4 (wafer process) is called a preprocess, in which actual circuits are formed on the wafers by means of photolithography using the above-described masks and wafers. The next step S5 (assembly) is called a postprocess which manufactures semiconductor chips using the wafers manufactured in step 54, and includes an assembling process (dicing and bonding), a packaging process (chip encapsulation), and the like. In step S6 (inspection), inspection operations, such as operation-confirming tests, durability tests and the like of the semiconductor devices manufactured in step S5, are performed. The manufacture of semiconductor devices is completed after passing through the above-described processes, and the manufactured devices are shipped (step S7).

Figure 12:
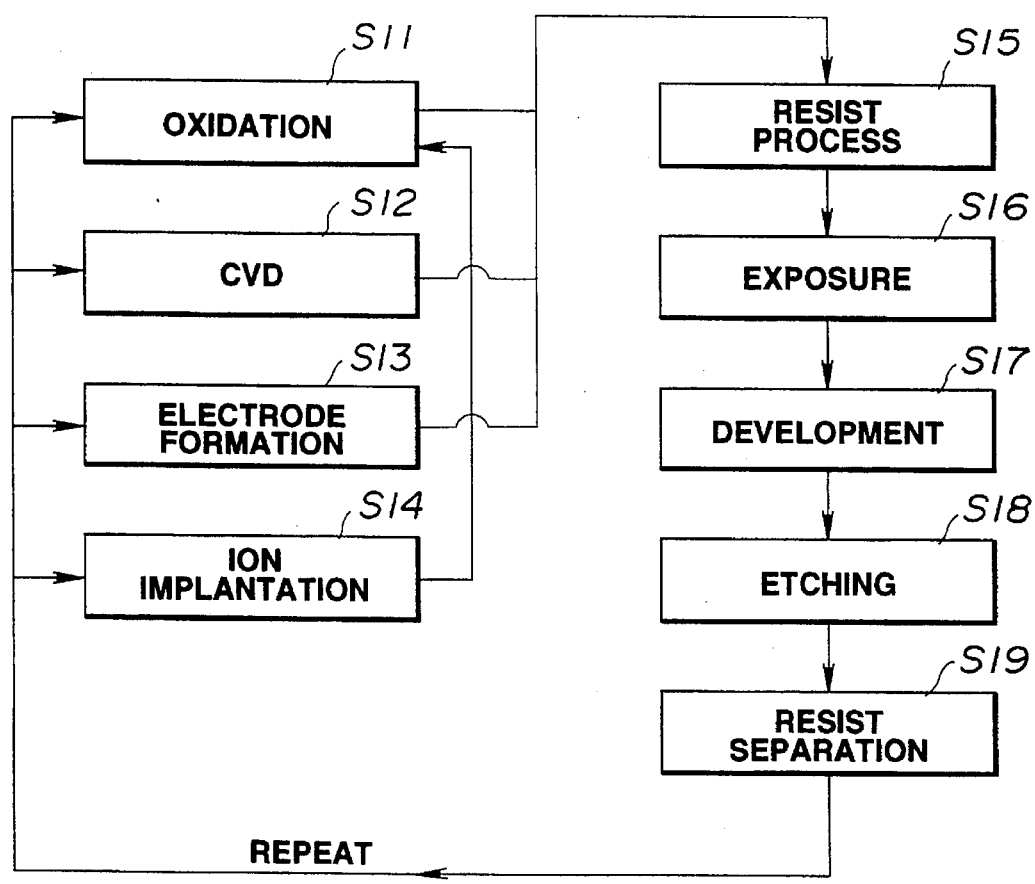
FIG. 12 is a detailed flowchart illustrating a wafer process shown in FIG. 11.
Figure 13:
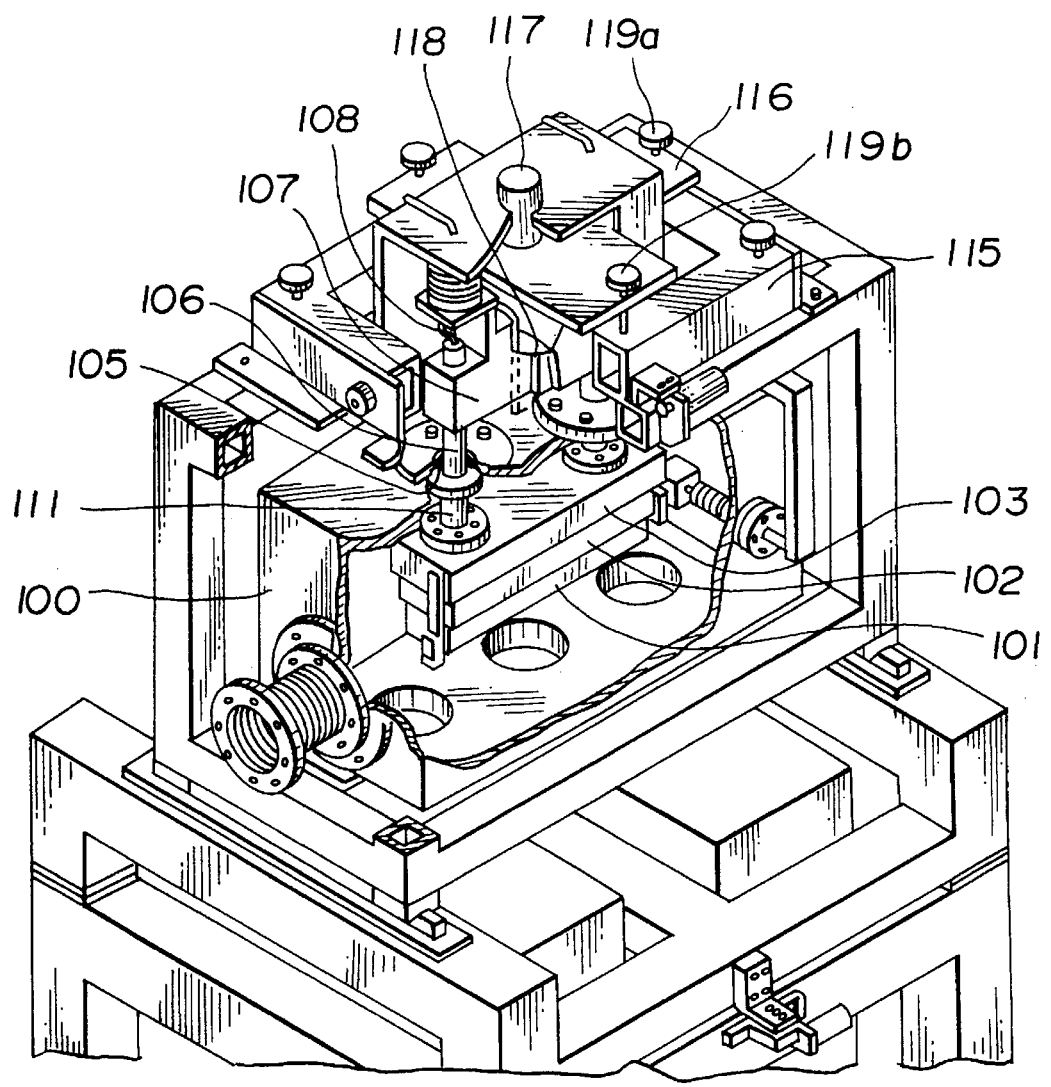
FIG. 13 is a partially-cutaway perspective view of a conventional exposure apparatus.
Figure 14:
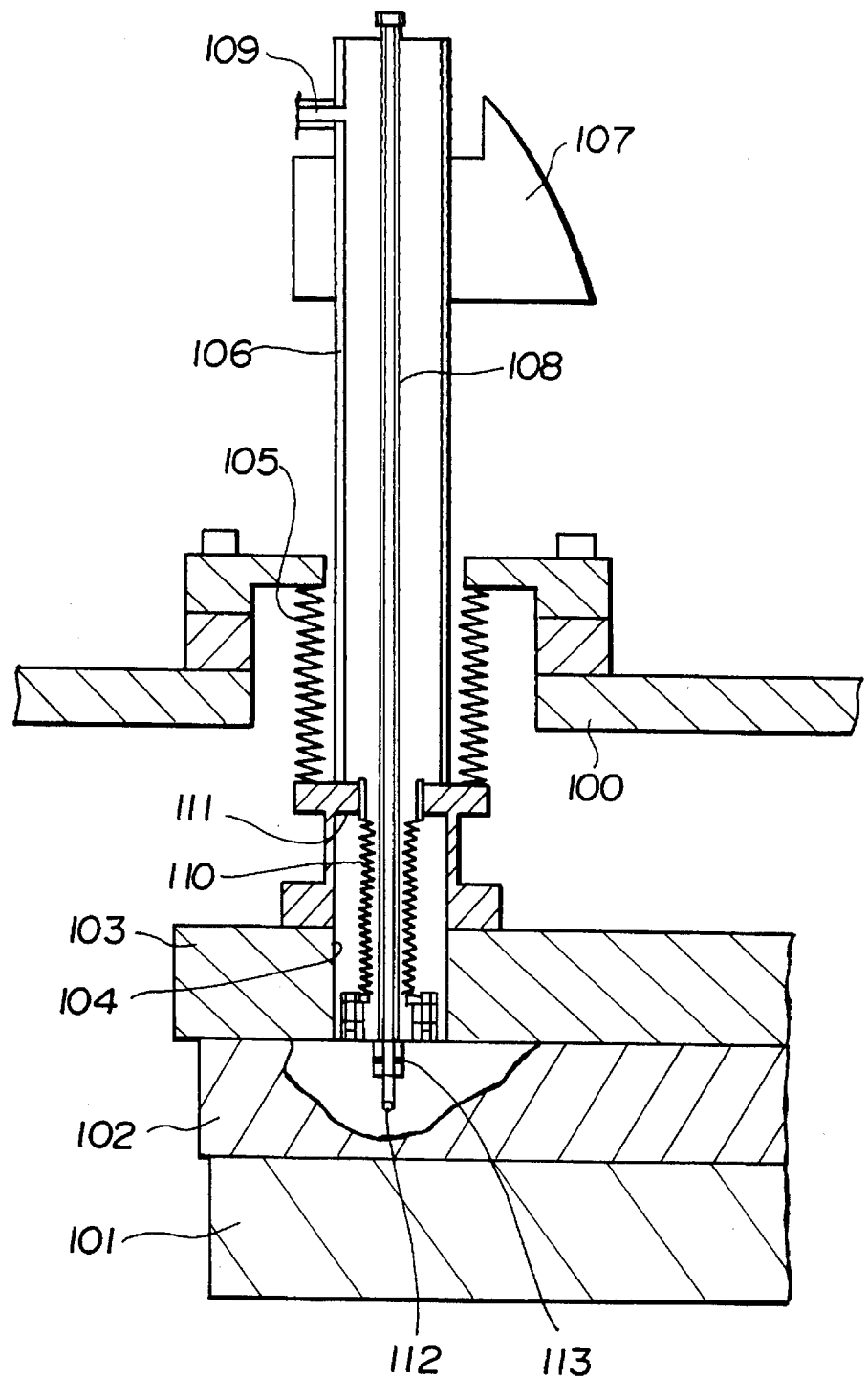
FIG. 14 is an enlarged cross-sectional view illustrating a mirror (reflecting mirror) unit shown in FIG. 13.

FIG. 12 is a detailed flowchart of the above-described wafer process. In step S11 (oxidation), the surface of the wafer is oxidized. In step S12 (CVD (chemical vapor deposition)), an insulating film is formed on the surface of the wafer. In step S13 (electrode formation), electrodes are formed on the surface of the wafer by vacuum deposition. In step S14 (ion implantation), ions are implanted into the wafer. In step S15 (resist process), a photosensitive material is coated on the wafer. In step S16 (exposure), the circuit pattern on the mask is exposed and printed on the wafer by the above-described exposure apparatus. In step S17 (development), the exposed wafer is developed. In step S18 (etching), portions other than the developed resist image are etched off. In step S19 (resist separation), the resist which becomes unnecessary after the completion of the etching is removed. By repeating these steps, a final circuit pattern made of multiple patterns is formed on the wafer. By using the manufacturing method of the present embodiment, it is possible to manufacture semiconductor devices with a high degree of integration which have previously been difficult to manufacture.

The individual components shown in outline or designated by blocks in the drawings are all well known in the mirror unit and exposure apparatus arts and their specific construction and operation are not critical to the operation or the best mode for carrying out the invention.

While the present invention has been described with respect to what is presently considered to be preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A mirror unit comprising:

a mirror having a reflecting surface;

a holding member for supporting said mirror; and an airtight chamber incorporating said mirror, supported by said holding member, in an airtight state, wherein one of said mirror and said holding member constitutes a portion of a side wall of said airtight chamber and said mirror is detachably mounted to said airtight chamber through an opening in the side wall.

2. A mirror unit according to claim 1, wherein said mirror comprises an X-ray mirror for reflecting X-rays.

3. A mirror unit according to claim 1, further comprising securing means for securing said mirror to said holding member.

4. A mirror unit according to claim 3, wherein said mirror secured to said holding member by said securing means comprises an integral member.

5. A mirror unit according to claim 4, further comprising means for mounting said integral member to said airtight chamber.

6. A mirror unit according to claim 5, further comprising a gasket provided between said integral member and said airtight chamber for assuring vacuum sealing of said airtight chamber.

7. A mirror unit according to claim 4, wherein said integral member further comprises means for cooling said airtight chamber.

8. An exposure apparatus comprising:

a radiation source for generating a radiation beam;

a mirror unit including a mirror for reflecting the radiation beam; and an exposure unit for exposing a substrate with the reflected radiation beam, wherein said mirror unit comprises:

a mirror having a reflecting surface;

a holding member for supporting said mirror; and an airtight chamber incorporating said mirror, supported by said holding member, in an airtight state, wherein one of said mirror and said holding member constitutes a portion of a side wall of said airtight chamber and said mirror is detachably mounted to said airtight chamber through an opening in the side wall.

9. An exposure apparatus according to claim 8, further comprising securing means for securing said mirror to said holding member.

10. An exposure apparatus according to claim 9, wherein said mirror secured to said holding member by said securing means comprises an integral member.

11. An exposure apparatus according to claim 10, further comprising means for mounting said integral member to said airtight chamber.

12. An exposure apparatus according to claim 11, further comprising a gasket provided between said integral member and said airtight chamber for assuring vacuum sealing of said airtight chamber.

13. An exposure apparatus according to claim 10, wherein said integral member further comprises means for cooling said airtight chamber.

14. An exposure apparatus according to claim 8, wherein the substrate comprises a wafer, on which said exposure unit transfers a pattern by exposure.

15. An exposure apparatus according to claim 8, wherein said radiation source comprises a synchrotron orbit radiation apparatus for emitting a sheet-shaped radiation beam.

16. An exposure apparatus according to claim 15, wherein said mirror spreads the sheet-shaped radiation beam emitted from said synchrotron orbit radiation apparatus in a direction perpendicular to a sheet plane of the radiation beam.

* * * * *

UNITED STATES PATENT AND TRADEMARK OFFICE
CERTIFICATE OF CORRECTION

PATENT NO. : 5,572,563
DATED : November 5, 1996
INVENTOR(S) : KAZUYUKI KASUMI, ET AL.

It is certified that error appears in the above-indentified patent and that said Letters Patent is hereby corrected as shown below:

COLUMN 3:

Line 19, "line A-A" should read --line 2-2--;
    Line 24, "line A-A" should read --line 4-4--;
    Line 32, "line A-A" should read --line 7-7--;
    Line 41, "line A-A" should read --line 9-9--;
    Line 67, "line A-A" should read --line 2-2--.

COLUMN 5:

Line 55, "A-A" should read --4-4--.

COLUMN 6:

Line 11, "chamber 8." should read --chamber 6.--.

UNITED STATES PATENT AND TRADEMARK OFFICE
CERTIFICATE OF CORRECTION

PATENT NO. : 5,572,563  
DATED : November 5, 1996  
INVENTOR(S) : KAZUYUKI KASUMI, ET AL.

It is certified that error appears in the above-indentified patent and that said Letters Patent is hereby corrected as shown below:

COLUMN 7:

Line 25, "line A-A" should read --line 7-7--.

COLUMN 9:

Line 8, "line A-A" should read --line 9-9--.

COLUMN 11:

Line 37, "step 54," should read --step S4,--.

Signed and Sealed this

Tenth Day of June, 1997

Attest:

BRUCE LEHMAN

Attesting Officer

Commissioner of Patents and Trademarks